(12) United States Patent
Schaffer et al.

(10) Patent No.: US 11,821,944 B2
(45) Date of Patent: Nov. 21, 2023

(54) APPARATUS AND A METHOD FOR MEASURING A DEVICE CURRENT OF A DEVICE UNDER TEST

(71) Applicant: Infineon Technologies AG, Neubiberg (DE)

(72) Inventors: Josef-Paul Schaffer, Bruckmühl (DE); Joost Adriaan Willemen, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/680,551

(22) Filed: Feb. 25, 2022

(65) Prior Publication Data
US 2022/0268834 A1  Aug. 25, 2022

(30) Foreign Application Priority Data
Feb. 25, 2021 (EP) .................. 21159136

(51) Int. Cl.
| | | |
|---|---|---|
| *G01R 31/02* | (2006.01) | |
| *G01R 31/26* | (2020.01) | |
| *G01R 31/30* | (2006.01) | |
| *G01R 31/319* | (2006.01) | |
(Continued)

(52) U.S. Cl.
CPC ..... *G01R 31/3004* (2013.01); *G01R 31/2884* (2013.01); *G01R 31/2886* (2013.01); *G01R 31/31924* (2013.01); *H01L 22/34* (2013.01); *H01L 2924/00* (2013.01); *H01L 2924/0002* (2013.01)

(58) Field of Classification Search
CPC .......... G01R 31/3004; G01R 31/31924; G01R 19/0023; G01R 19/00; G01R 31/52; G01R 31/2884; G01R 31/2886; G01R 31/2831; H01L 2924/00; H01L 2924/0002; H01L 22/34
USPC ......... 324/71, 378, 403, 415, 425, 500, 537, 324/762.01
See application file for complete search history.

(56) References Cited

U.S. PATENT DOCUMENTS

| | | | |
|---|---|---|---|
| 5,959,463 A | 9/1999 | Funakura et al. | |
| 2002/0070726 A1* | 6/2002 | Sugamori | G01R 31/31921 324/762.01 |
| 2003/0107395 A1 | 6/2003 | Kawasaki et al. | |

(Continued)

FOREIGN PATENT DOCUMENTS

DE       68908892 T2    10/1993

*Primary Examiner* — Raul J Rios Russo
(74) *Attorney, Agent, or Firm* — Murphy, Bilak & Homiller, PLLC

(57) ABSTRACT

An apparatus for measuring a device current of a device under test (DUT) includes a first circuit including a first terminal for coupling to a first connection terminal of the DUT. The first circuit is configured to supply a first test voltage for the first terminal and to output a first output voltage sensed at the first terminal. The apparatus further includes a second circuit having a second terminal for coupling to a second connection terminal of the DUT. The second circuit is configured to supply a second test voltage for the second terminal and to output a second output voltage sensed at the second terminal. The apparatus further includes a third circuit configured to determine the device current of the DUT based on the first output voltage, the second output voltage, the first test voltage and the second test voltage. The first circuit and the second circuit are identical.

15 Claims, 3 Drawing Sheets

(51) Int. Cl.
*G01R 31/28* (2006.01)
*H01L 21/66* (2006.01)

(56) References Cited

U.S. PATENT DOCUMENTS

| | | | |
|---|---|---|---|
| 2005/0275482 A1* | 12/2005 | Broomall | H01R 24/547 |
| | | | 333/127 |
| 2006/0132164 A1 | 6/2006 | Walker et al. | |
| 2007/0296454 A1 | 12/2007 | Koura | |
| 2013/0003034 A1 | 1/2013 | Verburg et al. | |
| 2014/0111188 A1* | 4/2014 | Goeke | H03F 3/45475 |
| | | | 324/123 R |
| 2018/0267129 A1* | 9/2018 | Belenguer Martinez | |
| | | | G01R 27/28 |
| 2021/0318361 A1* | 10/2021 | Knierim | G01R 19/0092 |

* cited by examiner

APPARATUS AND A METHOD FOR MEASURING A DEVICE CURRENT OF A DEVICE UNDER TEST

TECHNICAL FIELD

Examples relate to apparatuses and methods for measuring a device current of a device under test.

BACKGROUND

A device under test, DUT, may be a manufactured product undergoing testing, either at manufacture or later during its life cycle as part of ongoing functional testing and calibration checks. This can include a test after repair to establish that the product is performing in accordance with an original product specification. In the electronics industry the DUT may be any electronic assembly under test. For example, cell phones coming off an assembly line may be given a final test in the same way as the individual chips were earlier tested. Each cell phone under test is, briefly, the DUT. In semiconductor testing, the DUT may be a die on a wafer or the resulting packaged part.

A conventional apparatus for measuring a device current of a DUT may comprise a test circuit. The test circuit may comprise a terminal for coupling to a first connection terminal of the DUT. The test circuit can supply a test voltage to the terminal and output an output voltage sensed at the terminal. A second connection terminal of the DUT may be coupled to ground. The device current of the DUT is determined based on the output voltage and the test voltage. In this way, the apparatus can determine whether the DUT meets the required device specifications.

Low device currents are hard to test in production environments. Trials with test sets failed in production due to insufficient noise immunity. The apparatus for measuring the device current of the DUT is by nature high-impedance and therefore susceptible to electromagnetic interference, EMI, of neighboring electrical equipment. The EMI may result in noise and thus in a reduced measurement accuracy of low device currents in the DUT. To suppress EMI sources might be a way out but is often unrealistic. Known ways to suppress EMI are short test lines, shielding, and driven guard shields. Suppression performed by very short lines may require to rebuild an already existing test system for a new DUT, resulting in low flexibility and an inacceptable effort. Increasing the integration time may also suppress EMI but is undesirable with respect to test throughput. While some applications may demand measuring low device currents in DUT, the reduced measurement accuracy of low device currents in conventional systems may not allow to perform the measurement at the desired accuracy.

SUMMARY

Therefore, there is a need to provide an apparatus and a method for measuring a device current of the DUT, which possess a high measurement accuracy for low device currents in the DUT at high test throughput.

An example relates to an apparatus for measuring a device current of a DUT. The apparatus comprises a first circuit comprising a first terminal for coupling to a first connection terminal of the DUT. The first circuit is configured to supply a first test voltage to the first terminal and to output a first output voltage sensed at the first terminal. The apparatus further comprises a second circuit comprising a second terminal for coupling to a second connection terminal of the DUT. The second circuit is configured to supply a second test voltage to the second terminal and to output a second output voltage sensed at the second terminal. The apparatus further comprises a third circuit configured to determine the device current of the DUT based on the first output voltage, the second output voltage, the first test voltage and the second test voltage. The first circuit and the second circuit are identical. By using the first and second circuit, which are identical, the first and second circuits experience identical EMI. Because the first and second circuits experience identical EMI, the third circuit may eliminate the EMI by proper signal processing, e.g. by using the first output voltage, the second output voltage, the first test voltage and the second test voltage to determine the device current of the DUT. Eliminating the EMI may allow to measure low device currents of the DUT without increasing the integration time, which results in testing the device current of the DUT fast and at reasonable costs.

Another example relates to a method for measuring a device current of a DUT, with the apparatus mentioned above. The method comprises coupling the first terminal of the first circuit with the first connection terminal of the DUT. The method further comprises coupling the second terminal of the second circuit with the second connection terminal of the DUT. The method further comprises supplying the first test voltage to the first terminal and supplying the second test voltage to the second terminal. The method further comprises outputting the first output voltage sensed at the first terminal and outputting the second output voltage sensed at the second terminal. The method further comprises determining the device current of the DUT based on the first output voltage, the second output voltage, the first test voltage and the second test voltage. The first circuit as well as the second circuit experience the same amount of EMI. By determining the device current of the DUT based on the first output voltage, the second output voltage, the first test voltage and the second test voltage, the method enables to eliminate EMI, e.g. by subtraction.

BRIEF DESCRIPTION OF THE FIGURES

Some examples of apparatuses and/or methods will be described in the following by way of example only, and with reference to the accompanying figures, in which.

DETAILED DESCRIPTION

Figure 1:
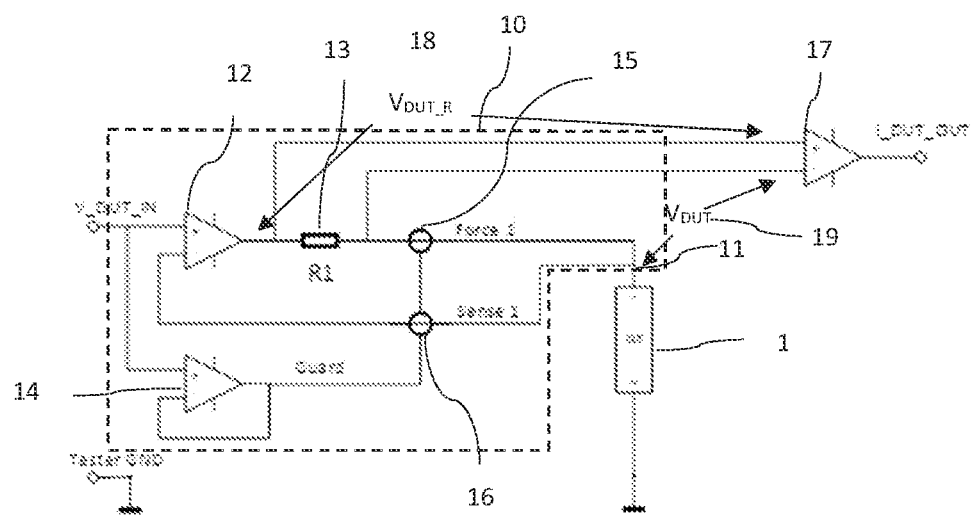
FIG. 1 shows a block diagram of a conventional apparatus for measuring a device current of a device under test.

Some examples are now described in more detail with reference to the enclosed figures. However, other possible examples are not limited to the features of these embodiments described in detail. Other examples may include modifications of the features as well as equivalents and alternatives to the features. Furthermore, the terminology used herein to describe certain examples should not be restrictive of further possible examples.

Throughout the description of the figures same or similar reference numerals refer to same or similar elements and/or features, which may be identical or implemented in a modified form while providing the same or a similar function. The thickness of lines, layers and/or areas in the figures may also be exaggerated for clarification.

When two elements A and B are combined using an 'or', this is to be understood as disclosing all possible combinations, i.e. only A, only B as well as A and B, unless expressly defined otherwise in the individual case. As an alternative wording for the same combinations, "at least one of A and B" or "A and/or B" may be used. This applies equivalently to combinations of more than two elements.

If a singular form, such as "a", "an" and "the" is used and the use of only a single element is not defined as mandatory either explicitly or implicitly, further examples may also use several elements to implement the same function. If a function is described below as implemented using multiple elements, further examples may implement the same function using a single element or a single processing entity. It is further understood that the terms "include", "including", "comprise" and/or "comprising", when used, describe the presence of the specified features, integers, steps, operations, processes, elements, components and/or a group thereof, but do not exclude the presence or addition of one or more other features, integers, steps, operations, processes, elements, components and/or a group thereof.

FIG. 1 shows a block diagram of conventional circuitry 10 for measuring a device current of a DUT 1. The circuit is configured to supply a test voltage 18 ($V_{DUT\_R}$) for a terminal 11 of DUT 1 by means of an operational amplifier 12 and to output an output voltage 19 ($V_{DUT}$) sensed at the terminal 11. The terminal 11 serves to couple the circuit 10 to a connection terminal of the DUT 1. The circuit 10 comprises an operational amplifier 12 outputting the test voltage, a resistive element 13, a feedback amplifier 14, a ground contact and a second operational amplifier 17. The operational amplifier 12 is configured to generate the test voltage based on a reference voltage and the output voltage. The resistive element 13 is coupled between an output of the operational amplifier 12 and the terminal 11. The voltage drop across the resistive element 13 is sensed by means of second operational amplifier 17 and serves to quantify the current through DUT 1. The feedback amplifier 14 is configured to receive the reference voltage at a first input of the feedback amplifier 14. An output of the feedback amplifier 14 is coupled to a second input of the feedback amplifier 14. The output of the feedback amplifier 14 is further coupled to a first node 15 between the output of the operational amplifier 12 and the terminal 11 and to a second node 16 between the terminal 11 and an inverting input of the operational amplifier 12. Feeding back the output voltage from terminal 11 to the inverting input of operational amplifier 12 makes the operational amplifier 12 output a test voltage that provides for the reference voltage being present at terminal 11 for connecting the DUT.

The first node 15 and the terminal 11 may be coupled via a force 1 line. The second node 16 and the terminal 11 may be coupled via a sense 1 line. The force 1 line and the sense 1 line are also referred to as connecting lines. The ground contact is configured for coupling to a second connection terminal of the DUT 1. In some cases, ground contact may be established by a second voltage source set to 0V. The second operational amplifier 17 is configured to sense the device current of the DUT 1 based on the test voltage and the output voltage sensed at the terminal 11. The conventional apparatus 10 is not able to measure low device currents in the DUT 1 properly in production environments since the test setup is by nature high-impedance and therefore susceptible to electromagnetic interference, EMI, of neighboring electrical equipment. EMI is a combination of two or more electromagnetic waves moving on intersecting or coincident paths. EMI on ground contact is different to the EMI on the connecting lines due to different wiring. Due to EMI being present while measuring low device currents in the DUT 1 the achieved accuracy may be insufficiently low.

In summary, the conventional apparatus 10 has drawbacks for measuring low currents in the DUT 1. Thus, there is a need for an apparatus, which allows a high measurement accuracy and a high throughput for measuring low currents in the DUT 1.

Figure 2:
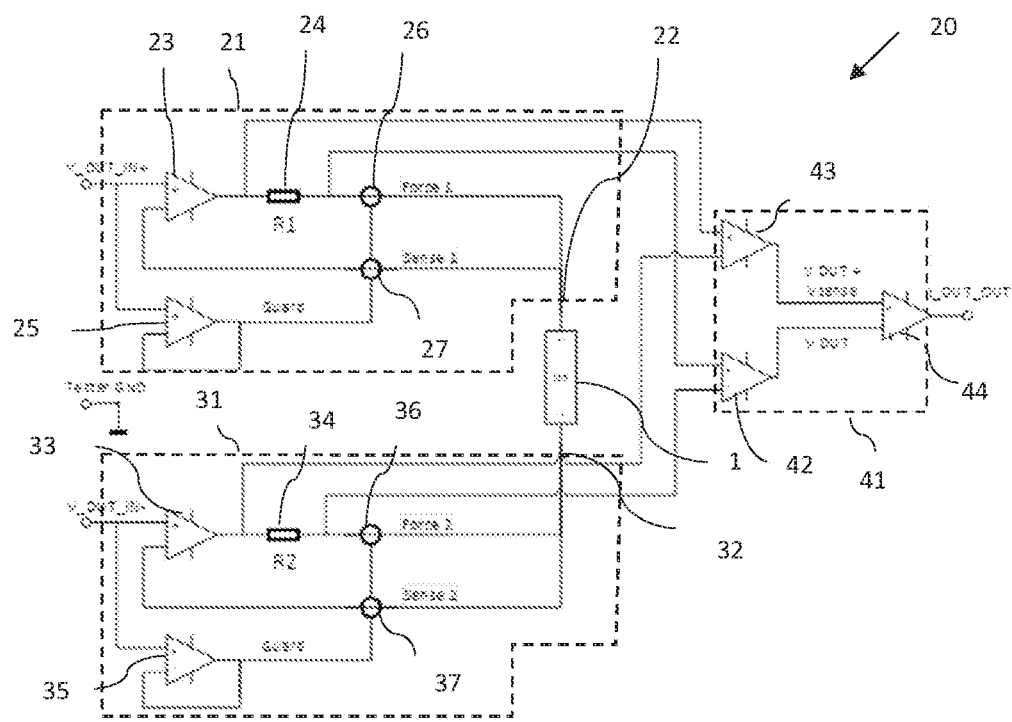
FIG. 2 shows a block diagram of an apparatus for measuring a device current of a device under test according to a first example of the present disclosure.

This need is, for example, met by the embodiment of an apparatus 20 for measuring a device current of a DUT 1 shown in FIG. 2. FIG. 2 shows a block diagram of the apparatus 20 for measuring the device current of the DUT 1 according to a first example of the present disclosure.

The apparatus 20 comprises a first circuit 21, a second circuit 31 and a third circuit 41. The first circuit 21 and the second circuit 31 are identical and correspond to circuit 10 of FIG. 1. Therefore, the features of both circuits 21 and 32 will only be shortly summarized again to avoid unnecessary redundancy.

The first circuit 21 is configured to supply a first test voltage V_DUT_R1 for a first terminal 22 and to output a first output voltage VDUT_P sensed at the first terminal 22. The first terminal 22 serves for coupling to a first connection terminal of the DUT 1. The first circuit 21 further comprises first operational amplifier 23, first resistive element 24 and first feedback amplifier 25.

The first terminal 22 may be an electrical connector at an endpoint of the first circuit 21 acting as the reusable interface to the DUT 1 and creating a point where the DUT 1 may be connected. The first terminal 22 may simply be an end of a wire and/or it may be fitted with a connector or fastener. The first connection terminal of the DUT 1 may be a point at which a conductor from the DUT 1 comes to an end. The first connection terminal of the DUT may also refer to an electrical connector at this endpoint, acting as the reusable interface to a conductor and creating a point where external circuits as the first circuit 21 may be connected. The first connection terminal may be a test pin.

The first operational amplifier 23 is configured to generate the first test voltage V_DUT_R1 based on a first reference voltage and the first output voltage VDUT_P. The operational amplifier may be a DC-coupled high-gain electronic voltage amplifier with a differential input and a single-ended output. The operational amplifier is one type of differential amplifier. Other types of differential amplifier include an instrumentation amplifier. The differential amplifier is a type of electronic amplifier that amplifies the difference between two input voltages but suppresses any voltage common to the two inputs. The differential amplifier may comprise two inputs and one output in which the output may be proportional to the difference between the two voltages.

The first resistive element 24 is coupled between an output of the first operational amplifier 23 and the first terminal 22. The first resistive element 24 may be a resistor with a known electrical resistance for example a sense resistor. The resistor is a passive two-terminal electrical component that implements electrical resistance as a component.

The first feedback amplifier 25 configured to receive the first reference voltage at a first input of the first feedback amplifier 23. The feedback amplifier 25 is an amplifier returning a part of the signal output from the feedback amplifier back to the input of the feedback amplifier. Feedback amplifier may be used to reduce the noise of a signal. Noise is a general term for unwanted modifications that a signal may suffer during capture, storage, transmission, processing, or conversion. An output of the first feedback amplifier 25 is coupled to a second input of the first feedback amplifier 25. The output of the first feedback amplifier 25 is further coupled to a first node 26 between the output of the first operational amplifier 23 and the first terminal 22 and to a second node 27 between the first terminal 22 and an input of the first operational amplifier 23 that experiences the first output voltage from the first terminal 22. A node may be any region on a circuit between two components. The first node 26 and the first terminal 22 may be coupled via a force 1 line. The second node 27 and the first terminal 32 may be coupled via a sense 1 line. The apparatus 20 may have relay switches to connect force lines and sense lines for system leakage tests without the DUT 1. A relay switch is an electrically operated switch. A switch is an electrical component that can disconnect or connect a conducting path in an electrical circuit, interrupting an electric current or diverting it from one conductor to another.

The second circuit 31 is configured to supply a second test voltage V_DUT_R2 for the second terminal 32 and to output a second output voltage V_DUT_N sensed at the second terminal 32. The first circuit 21 and the second circuit 31 are identical. Thus, the first circuit may have the same properties within a given default margin of error as the second circuit. The given default margin of error may be for example at most 1%, at most 0.5% or at most 0.1%. The first circuit and the second circuit may comprise identical components which may be wired in an identical manner Identical components mean that the components of one of the first circuit 21 and the second circuit 31 have exactly the same properties within the given default margin of error as the components of the other of the first circuit 21 and the second circuit 31. Components in such terms may be electrical components such as a differential amplifier or a resistor. Wired in an identical manner describes that components of the first circuit 21 and components of the second circuit 31 are coupled identically within the given default margin of error. The connecting lines may be symmetric. Hereby all impedances, line properties and wiring may be carried out as much symmetrical as possible.

The second circuit 31 comprises a second terminal 32 for coupling to a second connection terminal of the DUT 1. The second circuit 31 further comprise a second operational amplifier 33, a second resistive element 34 and a second feedback amplifier 35. The second terminal 32 may be implemented in a fashion similar to that of the first terminal 22 described in connection with the first circuit 21. The second connection terminal of the DUT 1 may be in a fashion similar to that of the first connection terminal of the DUT 1 described in connection with the first circuit 21.

The second operational amplifier 33 is configured to generate the second test voltage based on a second reference voltage and the second output voltage. The second operational amplifier 33 may be implemented in a fashion similar to that of the first operational amplifier 23 described in connection with the first circuit 21. The second resistive element 34 is be coupled between an output of the second operational amplifier 33 and the second terminal 32. The second resistive element 34 may be implemented in a fashion similar to that of the first resistive element 24 described in connection with the first circuit 21.

The second feedback amplifier 35 is configured to receive the second reference voltage at a first input of the second feedback amplifier 35. An output of the second feedback amplifier 35 may be coupled to a second input of the second feedback amplifier 35. The output of the second feedback amplifier 35 may be coupled to a first node 36 between the output of the second operational amplifier 33 and the second terminal 32 and to a second node 37 between the second terminal 32 and an input of the second operational amplifier 33 that may be configured to receive the second output voltage from the second terminal 32. The first node 36 and the second terminal 32 may be coupled via a force 2 line. The second node 37 and the second terminal 32 may be coupled via a sense 2 line. The force 2 line and the sense 2 line are also referred to as connecting lines.

The first reference voltage and the second reference voltage exhibit equal magnitudes and different polarities. The polarities of the first reference voltage and the second reference voltage may be opposite with opposite angles. The DUT 1 may be not biased with respect to ground, but by a symmetrical input of the first reference voltage V_DUT_IN+ and the second reference voltage V_DUT_IN−. To have the same first and second test voltage across the DUT 1, the magnitude of a supply voltage may be divided by 2 to generate the first reference voltage and the second reference voltage. The apparatus 20 may be producing the first reference voltage and the second reference voltage as a symmetrical input signal from the supply voltage as a single source signal. While the application of voltages with equal magnitude and different polarities as the first reference voltage and the second reference voltages are one possible choice, further embodiments may likewise use two reference voltages having a different interrelation. Principally, arbitrary choices may be made for the first reference voltage and the second reference voltages under the constraint of the required voltage difference for the DUT. This is because the disturbing EMI is predominantly eliminated by subtracting the signal of nodes of two identical circuits, which is to some significant extent independent from the reference voltages used. Therefore, further embodiments may use reference voltages with similar or identical voltage differences while the first reference voltage or the second reference voltage is shifted towards ground or set to ground. Using reference voltages with equal magnitude and different polarity, however, may use the full linear operating range of the amplifiers involved while also compensating at least a fraction of systematic leakage currents, which may depend on the magnitude of the reference voltages.

The third circuit 41 serves to determine the device current of the DUT 1 based on the first output voltage, the second output voltage, the first test voltage and the second test voltage. The third circuit 41 may be configured to determine a first voltage difference based on a difference between the first output voltage and the second output voltage. The third circuit 41 may further be configured to determine a second voltage difference based on a difference between the first test voltage and the second test voltage. The third circuit 41 may further be configured to determine the device current of the DUT 1 based on a ratio of a difference between the first voltage difference and the second voltage difference to a summed resistance of the first resistive element 24 and the second resistive element 34. The summed resistance may be the sum of a resistance of the first resistive element 24 and a resistance of the second resistive element 34.

The example for the third circuit 41 illustrated in FIG. 2 comprises a first instrumentation amplifier 42, a second instrumentation amplifier 43 and a third operational amplifier 44. The instrumentation amplifier is a type of differential amplifier. The first instrumentation amplifier 42 may be configured to receive the first output voltage and the second output voltage and to output the first voltage difference. The first instrumentation amplifier 42 comprises a first input coupled to the first circuit 21 and a second input coupled to the second circuit 31.

The second instrumentation amplifier 43 is configured to receive the first test voltage and the second test voltage and to output the second voltage difference. The second instrumentation amplifier 43 comprises a first input coupled to the first circuit 21 and a second input coupled to the second circuit 31. The third operational amplifier 44 outputs the difference between the first voltage difference and the second voltage difference. The third operational amplifier 44 comprises a first input coupled to the first instrumentation amplifier 42 and a second input coupled to the second instrumentation amplifier 43.

The first circuit 21 and the second circuit 31 are identical and hence experience an identical amount of EMI. The first instrumentation amplifier 42 and the second instrumentation amplifier 43 may form the first voltage difference of the first output voltage and the second output voltage including a voltage drop across the first resistive element 24. The second instrumentation amplifier 43 may form the second voltage difference of the first test voltage and the second test voltage including a voltage drop across the second resistive element 34. This eliminates EMI at least in a first order.

In summary, the embodiments described herein transform conventional circuitry for measuring a device current of a DUT into a fully symmetrical one, where the first connection terminal of the DUT 1, the second connection terminal of the DUT 1 and the connecting lines are all experiencing the same amount of the EMI. Within the third circuit 41, the first instrumentation amplifier 42, the second instrumentation amplifier 43 and the third operational amplifier 44 are subtracting the EMI and hence may eliminate a larger portion of the EMI without increasing the integration time. This makes testing faster and therefore less costly. The apparatus 20 may enable low leakage testing of a device current of, for example, at most 10 pA. The use of an embodiment of an apparatus 20 may be detected by only spotting products with similar tested leakage performance in a product specification. Guaranteeing for such low leakage may not be feasible using conventional circuitry for measuring device currents.

There is multiple ways to eliminate/subtract EMI based on the concept of symmetrizing circuitry for measuring a device currents. Other ways to cancel EMI disturbances in the measurement of the device current of the DUT 1 based on the first output voltage, the second output voltage, the first test voltage and the second test voltage are described in connection with FIGS. 3, 4 and 5.

Figure 3:
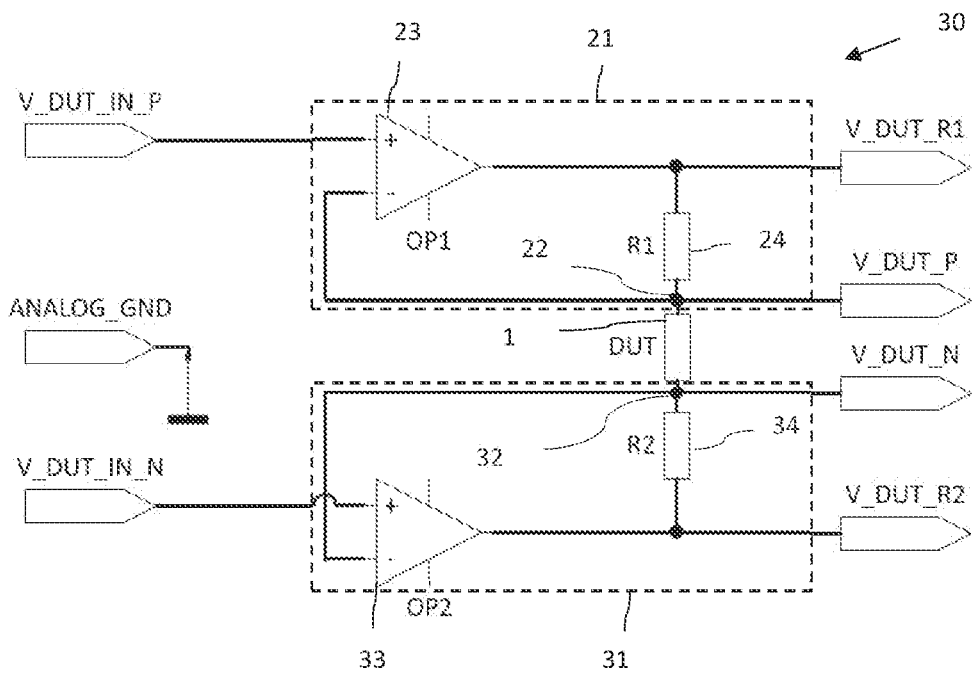
FIG. 3 shows a block diagram of an apparatus for measuring a device current of a device under test according to a second example of the present disclosure.

FIG. 3 shows a block diagram of an apparatus 30 for measuring a device current of a DUT 1 according to a second example of the present disclosure. The apparatus 30 comprises a first circuit 21 and a second circuit 31. The first circuit 21 and the second circuit 31 are identical.

The first circuit 21 may comprise a first terminal 22, a first operational amplifier 23 and a first resistive element 24 which are wired in a similar manner as described in connection with FIG. 2. The first circuit 21 is implemented in a fashion similar to that of the first circuit 21 described in connection with FIG. 2. The main difference is that the feedback amplifier 25 of the circuit illustrated in FIG. 2 is missing.

The second circuit 31 may comprise a second terminal 32, a second operational amplifier 33 and a second resistive element 34 which are wired in a similar manner as described in connection with FIG. 2. The second circuit 31 may be implemented in a fashion similar to that of the second circuit 31 described in connection with FIG. 2. The main difference is that the feedback amplifier 35 of the circuit illustrated in FIG. 2 is missing.

The first operational amplifier 23 and the second operational amplifier 33 drive a first reference voltage V_DUT_IN_P and a second reference voltage V_DUT_IN_N to establish the first test voltage V_DUT_R1 and the second test voltage V_DUT_R2 within the first circuit 21 and the second circuit 31. In an operational range of the first operational amplifier 23 and the second operational amplifier 33 there are the following node voltages:

$$V\_DUT\_P = V\_DUT\_IN\_P$$

$$V\_DUT\_N = V\_DUT\_IN\_N$$

with V_DUT_IN_P as the first reference voltage, V_DUT_IN_N as the second reference voltage, V_DUT_P as the first output voltage and V_DUT_N as the second output voltage. The first reference voltage and the second reference voltage may be low-ohmic nodes which may come from outputs of operational amplifiers. It may be advantageous to use these nodes for the evaluation of the node voltages.

Figure 4:
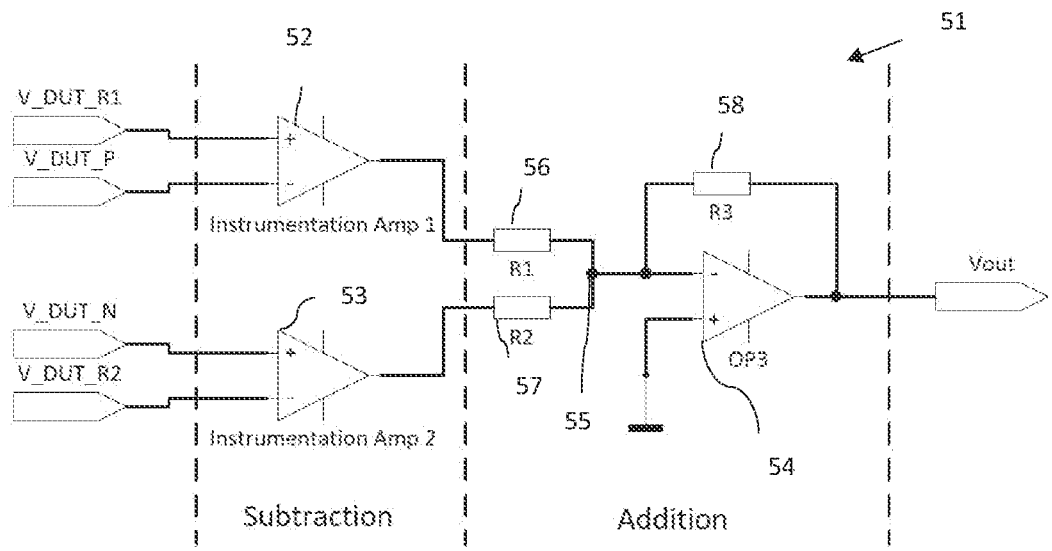
FIG. 4 shows a block diagram of a third circuit of an apparatus for measuring a device current of a device under test according to a first example of the present disclosure.
Figure 5:
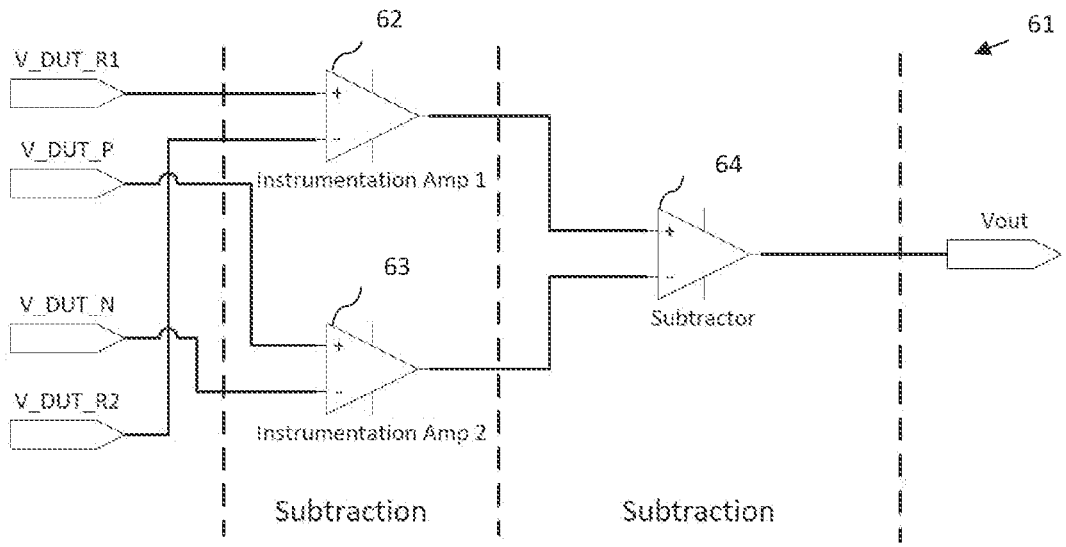
FIG. 5 shows a block diagram of a third circuit of an apparatus for measuring a device current of a device under test according to a second example of the present disclosure.

The apparatus 30 may be coupled with a third circuit shown in FIG. 4 or with a third circuit shown in FIG. 5.

More details and aspects are mentioned in connection with the embodiments described above or below. The example shown in FIG. 3 may comprise one or more optional additional features.

FIG. 4 shows a block diagram of a third circuit 51 of an apparatus for measuring a device current of a DUT according to a first example of the present disclosure. The third circuit 51 may be configured to determine the device current of the DUT by determining a first voltage difference based on a difference between a first output voltage and a first test voltage. The third circuit 51 may be configured further to determine the device current of the DUT by determining a second voltage difference based on a difference between a second output voltage and a second test voltage. The third circuit 51 may be configured further to determine the device current of the DUT by determining based on a ratio of a sum of the first voltage difference and the second voltage difference to a summed resistance of the first resistive element 24 and the second resistive element 34.

The third circuit 51 comprises a first instrumentation amplifier 52, a second instrumentation amplifier 53, a summing node 55, a third operational amplifier 54, a first resistor 56, a second resistor 57, and a third resistor 58. The first instrumentation amplifier 52 may be configured to receive the first output voltage V_DUT_P and the first test voltage V_DUT_R1 and to output the first voltage difference. A first input and a second input of the first instrumentation amplifier 52 may be coupled to the first circuit 21 shown in FIG. 3. The second instrumentation amplifier 53 may be configured to receive the second test voltage V_DUT_R2 and the second output voltage V_DUT_N and to output the second voltage difference. A first input and a second input of the second instrumentation amplifier 53 may be coupled to the second circuit 31 shown in FIG. 3. The summing node 55 may be configured to combine the first voltage difference from the first instrumentation amplifier 52 and the second voltage difference from the second instrumentation amplifier 53. The third operational amplifier 54 is configured to output the sum of the first voltage difference and the second voltage difference. The third operational amplifier 54 comprises a first input coupled to the summing node 55 and a second input coupled to ground. The first resistor 56 is coupled between the first instrumentation amplifier 52 and the summing node 55. The second resistor 57 is coupled between the second instrumentation amplifier 53 and the summing node 55. The third resistor 58 is be coupled to the first input of the third operational amplifier 54 and an output of the third operational amplifier 54.

Using the third circuit 510 FIG. 4, determining the device current I_DUT of the DUT 1 may be achieved by:

$$I\_DUT = ((V\_DUT\_R1 - VDUT\_P) + (V\_DUT\_N - V\_DUT\_R2))/(R1 + R2) \quad \text{Equation 1}$$

with V_DUT_R1 being the first test voltage, V_DUT_R2 being the second test voltage, R1 being a resistance of a first resistive element 24 and R2 being a resistance of a second resistive element 34. A circuit implementation of equation 1 is shown in FIG. 4. Analog processing of the voltages may be enough.

More details and aspects are mentioned in connection with the embodiments described above or below. The example shown in FIG. 4 may comprise one or more optional additional features.

FIG. 5 shows a block diagram of a third circuit 61 of an apparatus for measuring a device cur-rent of a DUT 1 according to a second example of the present disclosure. The third circuit 61 comprises a first instrumentation amplifier 62, a second instrumentation amplifier 63 and a third operational amplifier 64 which are wired in a similar manner as the third circuit 41 described in connection with FIG. 2. The third circuit 61 may be implemented in a fashion similar to that of the third circuit 41 described in connection with FIG. 2.

Determining the device current I_DUT of the DUT 1 may be achieved by:

$$I\_DUT = ((V\_DUT\_R1 - VDUT\_R2) - (V\_DUT\_P - V\_DUT\_N))/(R1 + R2) \quad \text{Equation 2}$$

The node voltages are defined as in connection with equation 1 and FIG. 4. A circuit implementation of equation 2 is shown in FIG. 5.

More details and aspects are mentioned in connection with the embodiments described above or below. The example shown in FIG. 5 may comprise one or more optional additional features.

Figure 6:
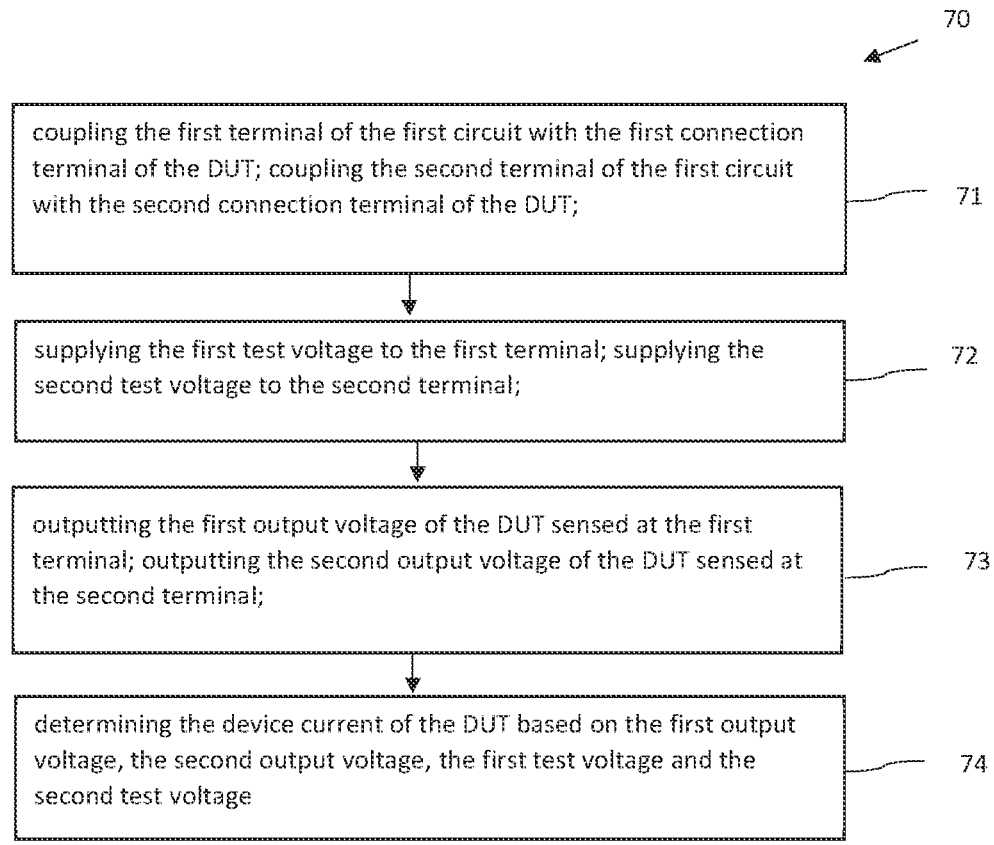
FIG. 6 shows a flow chart of a method for measuring a device current of a device under test according to a first example of the present disclosure.

FIG. 6 shows a flow chart of a method 70 for measuring a device current of a DUT with the apparatus 20, 30 according to a first example of the present disclosure.

The method 70 comprises coupling 71 the first terminal of the first circuit with the first connection terminal of the DUT. The method 70 further comprises coupling 71 the second terminal of the first circuit with the second connection terminal of the DUT. The method 70 further comprises 72 supplying the first test voltage to the first terminal. The method 70 further comprises supplying 72 the second test voltage to the second terminal. The method 70 further comprises outputting 73 the first output voltage sensed at the first terminal. The method 70 further comprises outputting 73 the second output voltage sensed at the second terminal. The method 70 further comprises determining 74 the device current of the DUT based on the first output voltage, the second output voltage, the first test voltage and the second test voltage.

The method 70 may further comprise comparing the device current of the DUT to a threshold value. The threshold value may be for example at most 10 pA. The method 70 may further comprise determining that the DUT does not satisfy a predetermined quality criterium if the device current of the DUT is above the threshold value. The predetermined quality criterium may be defined in a product specification of the DUT.

More details and aspects are mentioned in connection with the embodiments described above or below. The example shown in FIG. 6 may comprise one or more optional additional features.

The previous paragraphs illustrated embodiments that allow to measure small device currents drawn by a device or by a circuit (by any DUT). By measuring the device current, it may be determined whether a particular DUT meets given device specifications. The device current may also be referred to as a leakage current if the current through the device is undesirable or, generally, as a DUT current. Embodiments may be configured to measure the device current of a semiconductor device, in particular an electrostatic discharge (ESD) protection device. The ESD protection device may protect a circuit from an ESD, in order to prevent a malfunction or breakdown of an electronic device. ESD is a sudden flow of electricity between two electrically charged objects caused by contact, an electrical short, or dielectric breakdown. ESD devices may be built using semiconductor device. A semiconductor device is an electronic component that relies on the electronic properties of a semiconductor material for example silicon, germanium, and gallium arsenide, as well as organic semiconductors for its function. The semiconductor device may be for example a Field-effect transistor, FET such as a Metal-oxide-semiconductor FET, MOSFET or a diode such as a Light-emitting diode, LED. The FET is a type of transistor which uses an electric field to control the flow of current. FETs are devices with three terminals: source, gate, and drain. FETs control the flow of a current by an application of a voltage to the gate, which in turn alters the conductivity between the drain and source. A diode is a two-terminal electronic component that conducts current primarily in one direction, it has low resistance in one direction, and high resistance in the other. Not only for ESD devices but, for example, also for low current applications like pH sensors, brain wave sensors and electrocardiography, ECG, recording low leakage is essential. ECG recording may, for example, also be used in a wearable market. Therefore, embodiments described herein may be used to measure the device current of a pH sensor, a brain wave sensor and/or sensors used for ECG recording. In summary, there is a wide range of applications for the embodiments described herein.

The aspects and features described in relation to a particular one of the previous examples may also be combined with one or more of the further examples to replace an identical or similar feature of that further example or to additionally introduce the features into the further example.

It is further understood that the disclosure of several steps, processes, operations or functions disclosed in the description or claims shall not be construed to imply that these operations are necessarily dependent on the order described, unless explicitly stated in the individual case or necessary for technical reasons. Therefore, the previous description does not limit the execution of several steps or functions to a certain order. Furthermore, in further examples, a single step, function, process or operation may include and/or be broken up into several sub-steps, -functions, -processes or -operations.

If some aspects have been described in relation to a device or system, these aspects should also be understood as a description of the corresponding method. For example, a block, device or functional aspect of the device or system may correspond to a feature, such as a method step, of the corresponding method. Accordingly, aspects described in relation to a method shall also be understood as a description of a corresponding block, a corresponding element, a property or a functional feature of a corresponding device or a corresponding system.

The following claims are hereby incorporated in the detailed description, wherein each claim may stand on its own as a separate example. It should also be noted that although in the claims a dependent claim refers to a particular combination with one or more other claims, other examples may also include a combination of the dependent claim with the subject matter of any other dependent or independent claim. Such combinations are hereby explicitly proposed, unless it is stated in the individual case that a particular combination is not intended. Furthermore, features of a claim should also be included for any other independent claim, even if that claim is not directly defined as dependent on that other independent claim.

What is claimed is:

1. An apparatus for measuring a device current of a device under test (DUT), the apparatus comprising:
    a first circuit comprising a first terminal for coupling to a first connection terminal of the DUT, wherein the first circuit is configured to supply a first test voltage for the first terminal and to output a first output voltage sensed at the first terminal;
    a second circuit comprising a second terminal for coupling to a second connection terminal of the DUT, wherein the second circuit is configured to supply a second test voltage for the second terminal and to output a second output voltage sensed at the second terminal; and
    a third circuit configured to determine the device current of the DUT based on the first output voltage, the second output voltage, the first test voltage, and the second test voltage,
    wherein the first circuit and the second circuit are identical.

2. The apparatus of claim 1, wherein the first circuit and the second circuit comprise identical components which are wired in an identical manner.

3. The apparatus of claim 1, wherein the first circuit comprises a first operational amplifier configured to generate the first test voltage based on a first reference voltage and the first output voltage, and wherein a first resistive element is coupled between an output of the first operational amplifier and the first terminal.

4. The apparatus of claim 3, wherein the first circuit comprises a first feedback amplifier configured to receive the first reference voltage at a first input of the first feedback amplifier, wherein an output of the first feedback amplifier is coupled to a second input of the first feedback amplifier, and wherein the output of the first feedback amplifier is coupled to a first node between the output of the first operational amplifier and the first terminal and to a second node between the first terminal and an input of the first operational amplifier that is configured to receive the first output voltage from the first terminal.

5. The apparatus of claim 3, wherein the second circuit comprises a second operational amplifier configured to generate the second test voltage based on a second reference voltage and the second output voltage, and wherein a second resistive element is coupled between an output of the second operational amplifier and the second terminal.

6. The apparatus of claim 5, wherein the second circuit comprises a second feedback amplifier configured to receive the second reference voltage at a first input of the second feedback amplifier, wherein an output of the second feedback amplifier is coupled to a second input of the second feedback amplifier, and wherein the output of the second feedback amplifier is coupled to a first node between the output of the second operational amplifier and the second terminal and to a second node between the second terminal and an input of the second operational amplifier that is configured to receive the second output voltage from the second terminal.

7. The apparatus of claim 5, wherein the first reference voltage and the second reference voltage exhibit equal magnitudes and different polarities.

8. The apparatus of claim 3, wherein the third circuit is configured to determine the device current of the DUT by:
    determining a first voltage difference based on a difference between the first output voltage and the first test voltage;
    determining a second voltage difference based on a difference between the second output voltage and the second test voltage;
    determining a sum of the first voltage difference and the second voltage difference; and
    determining the device current of the DUT based on a ratio of the sum of the first voltage difference and the second voltage difference to a summed resistance of the first resistive element and the second resistive element.

9. The apparatus of claim 8, wherein the third circuit comprises:
    a first instrumentation amplifier configured to receive the first output voltage and the first test voltage and to output the first voltage difference;
    a second instrumentation amplifier configured to receive the second test voltage and the second output voltage and to output the second voltage difference;
    a summing node configured to combine the first voltage difference from the first instrumentation amplifier and the second voltage difference from the second instrumentation amplifier, and
    a third operational amplifier comprising a first input coupled to the summing node and a second input coupled to ground, wherein the third operational amplifier is configured to output the sum of the first voltage difference and the second voltage difference, wherein an output of the third operational amplifier is coupled with the first input of the third operational amplifier.

10. The apparatus of claim 9, wherein the third circuit further comprises a first resistor coupled between the first instrumentation amplifier and the summing node, a second resistor coupled between the second instrumentation amplifier and the summing node and a third resistor coupled to the first input of the third operational amplifier and an output of the third operational amplifier.

11. The apparatus of claim 3, wherein the third circuit is configured to determine the device current of the DUT by:
   determining a first voltage difference based on a difference between the first output voltage and the second output voltage;
   determining a second voltage difference based on a difference between the first test voltage and the second test voltage;
   determining a difference between the first voltage difference and the second voltage difference; and
   determining the device current of the DUT based on a ratio of the difference between the first voltage difference and the second voltage difference to a summed resistance of the first resistive element and the second resistive element.

12. The apparatus of claim 11, wherein the third circuit comprises:
   a first instrumentation amplifier configured to receive the first output voltage and the second output voltage and to output the first voltage difference;
   a second instrumentation amplifier configured to receive the first test voltage and the second test voltage and to output the second voltage difference; and
   a third operational amplifier comprising a first input coupled to the first instrumentation amplifier and a second input coupled to the second instrumentation amplifier, wherein the third operational amplifier is configured to output the difference between the first voltage difference and the second voltage difference.

13. The apparatus of claim 1, wherein the apparatus is configured to measure the device current of an electrostatic discharge (ESD) protection device.

14. A method for measuring a device current of a device under test (DUT) with the apparatus of claim 1, the method comprising:
   coupling the first terminal of the first circuit with the first connection terminal of the DUT;
   coupling the second terminal of the second circuit with the second connection terminal of the DUT;
   supplying the first test voltage to the first terminal;
   supplying the second test voltage to the second terminal;
   outputting the first output voltage sensed at the first terminal;
   outputting the second output voltage sensed at the second terminal; and
   determining the device current of the DUT based on the first output voltage, the second output voltage, the first test voltage and the second test voltage.

15. The method of claim 14, further comprising:
   comparing the device current of the DUT to a threshold value; and
   determining that the DUT does not satisfy a predetermined quality criterium if the device current of the DUT is above the threshold value.

\* \* \* \* \*